United States Patent [19]

Gliebe et al.

[11] Patent Number: 5,229,752
[45] Date of Patent: Jul. 20, 1993

[54] METHOD AND APPARATUS FOR DETECTING TIMING ERRORS IN A SYSTEM OSCILLATOR

[75] Inventors: Ronald J. Gliebe, Library; William R. Kramer, Bethel Park, both of Pa.

[73] Assignee: The United States of America as represented by the United States Department of Energy, Washington, D.C.

[21] Appl. No.: 762,968

[22] Filed: Sep. 20, 1991

[51] Int. Cl.⁵ .................... G08B 21/00; H03B 1/00
[52] U.S. Cl. ............................. 340/658; 331/64; 375/120
[58] Field of Search ............. 340/658, 309.15, 825.14, 340/870.25; 324/521, 83 FE; 375/120; 307/262, 269, 514, 516; 361/85; 331/25, 64; 328/133–134; 371/61

[56] References Cited

U.S. PATENT DOCUMENTS

| | | | |
|---|---|---|---|
| 3,697,690 | 10/1972 | Aaron et al. | 375/120 |
| 3,939,438 | 2/1976 | Taylor | 331/14 |
| 4,380,083 | 4/1983 | Andersson et al. | 375/120 |
| 4,410,861 | 10/1983 | Werner | 331/25 |
| 4,459,559 | 7/1984 | Crowley | 331/1 A |
| 4,463,321 | 7/1984 | Horner | 331/1 R |
| 4,628,269 | 12/1986 | Hunninghaus et al. | 307/269 X |
| 4,782,499 | 11/1988 | Clendening | 375/109 |
| 4,910,755 | 3/1990 | Knapp | 375/120 |

OTHER PUBLICATIONS

"Logic Gates and LED Indicate Phase Lock", Electronics, p. 106, May 1975.

Primary Examiner—Thomas Mullen
Attorney, Agent, or Firm—Virginia B. Caress; William R. Moser; Richard E. Constant

[57] ABSTRACT

A method of detecting timing errors in a system oscillator for an electronic device, such as a power supply, includes the step of comparing a system oscillator signal with a delayed generated signal and generating a signal representative of the timing error when the system oscillator signal is not identical to the delayed signal. An LED indicates to an operator that a timing error has occurred. A hardware circuit implements the above-identified method.

10 Claims, 5 Drawing Sheets

METHOD AND APPARATUS FOR DETECTING TIMING ERRORS IN A SYSTEM OSCILLATOR

The Government has rights in this invention pursuant to Contract No. N00024-79-C-4026.

BACKGROUND OF THE INVENTION

1. Field of the Invention

The present invention relates generally to a method and apparatus for detecting timing errors in a oscillator system, and in particular to a method and apparatus for detecting timing errors in a system oscillator's signal.

2. Description of Related Art

System oscillators play a vital role in almost any electronic circuit which requires synchronous operation. When a system oscillator is in error, many timing problems can occur which may result in damage to the electronic circuit.

In a communication system, for example, a timing error may cause a signal containing data to become garbled. In a power supply, a timing error in the system oscillator signal can cause the power supply to destroy itself or blow a fuse.

Timing errors within a signal generated by a system oscillator can generally be classified into two general classes: timing dependent errors and missing pulses. Timing dependent errors are generally delayed pulses which are caused by a system oscillator's frequency wandering due to any number of conditions. Missing pulses are generated when the oscillator, for some reason, completely misses a pulse. Both of these errors are equally damaging to a system.

A static inverter power supply, for example, is designed to convert direct current (DC) voltages into alternating current (AC) voltages. Static inverter power supplies are such that frequency regulation, voltage regulation and output distortion control each greatly increase the cost of a static power supply.

In order to minimize costs of a static inverter power supply, less attention is paid to the frequency regulation aspect of a power supply. In order to correct this deficiency and protect any electronic circuits connected to the power supply, a system is needed which can inexpensively and accurately detect timing errors in the system oscillator for a static inverter power supply or any other system oscillator.

SUMMARY OF THE INVENTION

It is therefore an object of the present invention to provide a method and apparatus for detecting a timing error in an oscillator for an electronic system.

It is another object of the present invention to provide a method and apparatus of detecting a timing error in an oscillator and generating an indication signal when an error is detected.

The present invention is a method of detecting and indicating an error in an oscillator signal wherein the oscillator signal is compared to a delayed copy of the oscillator signal and an error signal is generated if a timing error has occurred as determined by the comparison. The present invention is an electronic circuit which implements the above-described method.

BRIEF DESCRIPTION OF THE DRAWINGS

These and other objects, features and benefits of the present invention will become readily apparent to those skilled in the art from the following description of the preferred embodiment and drawings of the preferred embodiment, in which.

DETAILED DESCRIPTION OF THE PREFERRED EMBODIMENT

Figure 1:
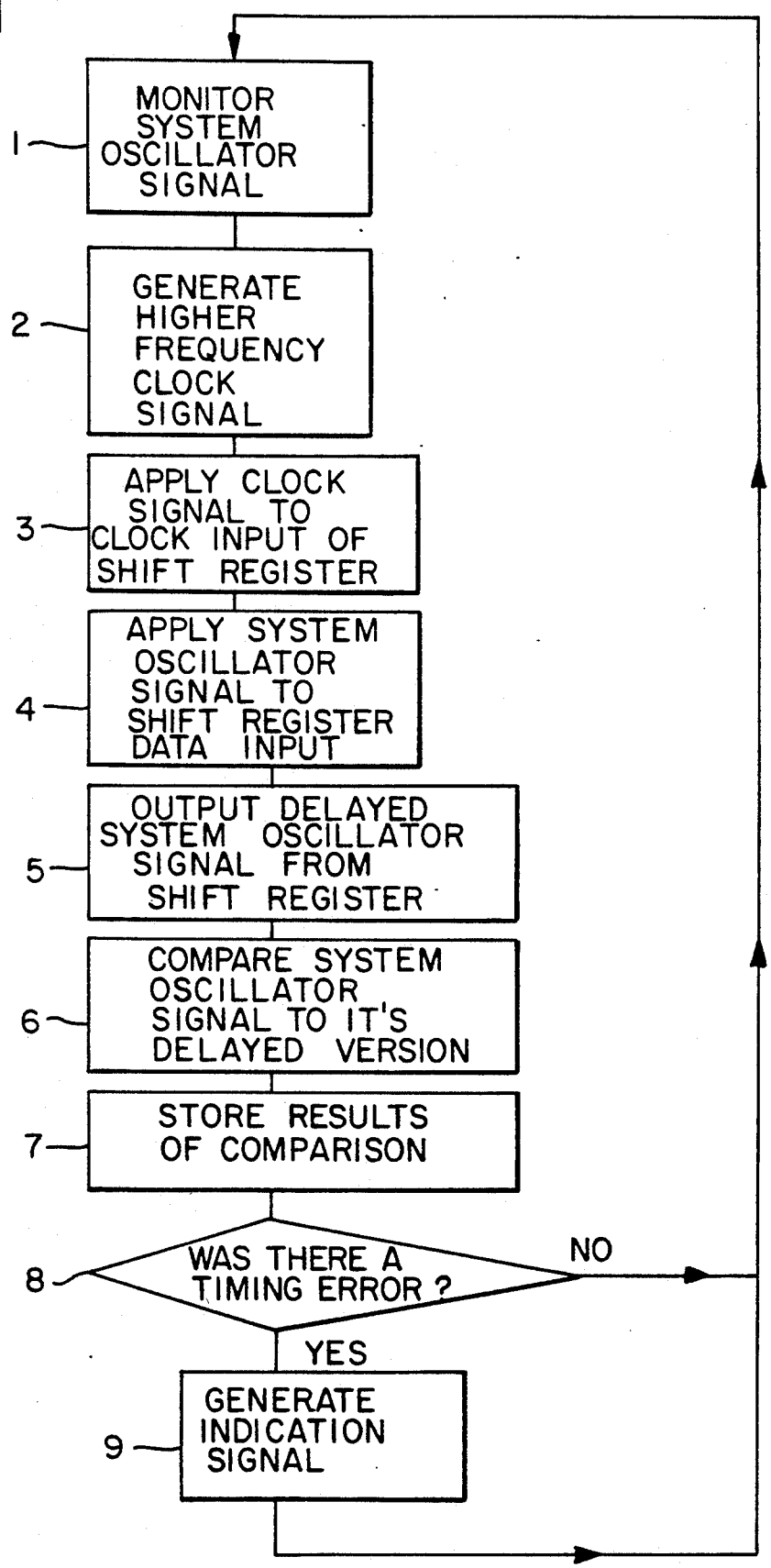
FIG. 1 is a flowchart which illustrates a method of system oscillator timing error detection which is a preferred embodiment of the present invention.

A method and apparatus for detecting and indicating that a timing error has occurred, will now be described with reference to the drawings, wherein like numerals denote like parts. A timing error detector and signal generator serves as a valuable troubleshooting aid for any system which has a system oscillator. With reference now to FIG. 1, a system oscillator timing error detector method flowchart is shown.

The method is executed every time a system oscillator signal is detected, step 1, and continues with step 2 wherein a clock signal is generated, which is in-phase with the original system oscillator signal. The clock signal may be of a higher frequency than the system oscillator signal, but it must be in-phase in order to maintain timing characteristics between the system oscillator and the clock signal.

Next, as shown in step 3, the clock signal is input to the shift register.

As illustrated in step 4, the system oscillator signal is applied to the shift register. In step 5, the system oscillator signal is delayed by one period and output as a delayed signal. As shown in step 6, the delayed signal and the system oscillator signal are then compared to each other. The results of the comparison are stored as shown in step 7. The delay from step 5 permits the detection of a timing error in the system oscillator signal. If no timing error has occurred, the delayed signal and the system oscillator signal will be identical when compared in step 6. Otherwise, the two signals will differ thereby indicating a timing error.

In step 8, if a timing error did not occur, the program returns to step 1 and begins again with a new system oscillator signal. If an error was detected, control continues to step 9 wherein an indication signal is generated to indicate to an operator that a possible fatal timing error has occurred in the system oscillator. This allows the operator to stop the system which contains the system oscillator with the timing error and fix the problem.

Figure 2:
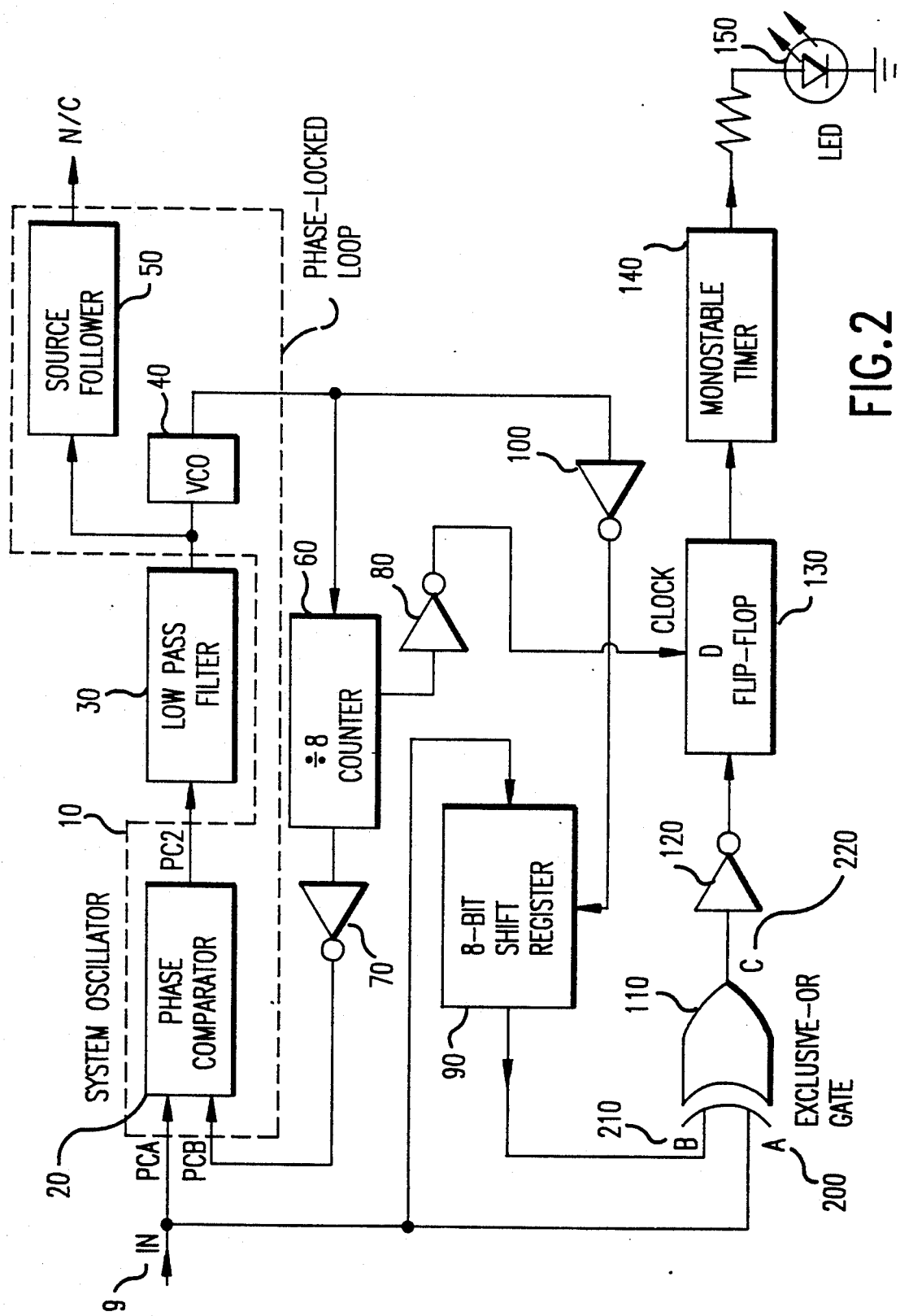
FIG. 2 is a schematic block diagram of a circuit which implements the method of FIG. 1.

A hardware circuit which implements the method of FIG. 1, will now be described with reference to FIG. 2 wherein a schematic block diagram of a timing error detector for a system oscillator is shown. A system oscillator signal is input to the timing error detector through IN line 9. The IN line 9 is connected to the PCA input of a phase-locked loop 10 which is shown within the dashed lines of FIG. 2.

The phase-locked loop 10 is made up of a phase comparator 20, a voltage controlled oscillator (VCO) 40 and a source follower 50 (which is not necessary for this invention). The IN line 9 is one input PCA of the phase comparator 20 while the other input is a signal PCB which is generated by an inverter 70 which forms part of the phase-locked loops feedback circuit. The output of the phase comparator 20 is a signal representative of the phase error between the inputs PCA and PCB and is inputted into a low-pass filter 30 which filters out any extraneous high frequency noise. The output of the low-pass filter is connected to the input of the source follower 50 and the input of the VCO 40.

The VCO generates an in-phase clock signal which has a frequency equal to eight times that of the signal on the IN line 9. The signal output by the VCO 40 is a square wave, and it is connected to a divide-by-N counter (which is set to N=8) 60 and a shift register 90. The divide-by-N counter 60 outputs a signal which has a frequency which is equal to the signal on the IN line 9. The output of the divide-by-N counter 60 is connected to the inverter 70 and another inverter 80.

Inverter 70 inverts the signal from the divide-by-N counter 60 and sends the inverted signal to the PCB input of the phase comparator 20. The phase-locked loop's feedback loop ensures that the system oscillator signal on IN line 9 and the in-phase clock signal are always in-phase for the operation of this timing error detector circuit. Thus, the phase-locked loop 10 constantly adjusts its frequency, via signal PCB, to ensure that the system oscillator signal and the in-phase clock signal are in-phase.

An 8-bit shift register 90 takes the system oscillator signal on the IN line 9 and generates a delayed system oscillator signal which is fed into a B input 210 of an Exclusive OR (XOR) gate 110. The shift register 90 is clocked by an inverted VCO clock signal which is generated by an inverter 100.

Figure 3:
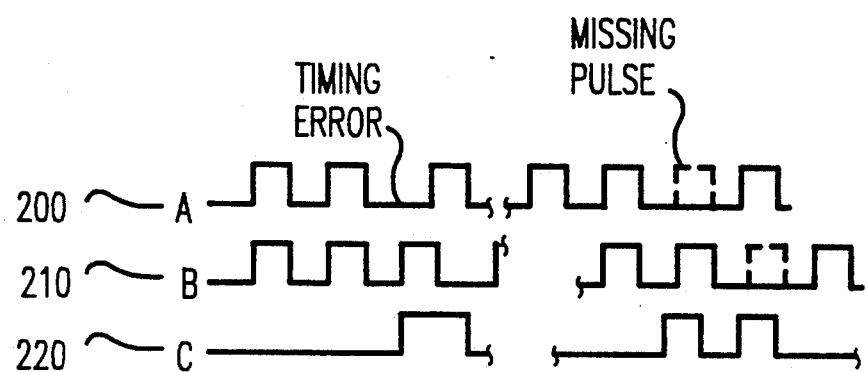
FIG. 3 is a timing diagram showing the operation of the circuit of FIG. 1.

An input A 200 of the XOR gate 110 is connected directly to the IN line 9. The signals output by the XOR gate 110, on line C 220, are positive pulses whenever the signals at input A 200 and input B 210 are different. A timing diagram, showing the lines A 200, B 210, and C 220 of the XOR gate 110, is shown in FIG. 3. These diagrams show how the output C 220 of the XOR gate 110 depends on inputs A 200 and B 210.

The output C 220 of the XOR gate 110, feeds an inverter 120 which inverts the signal and feeds it into a D flip-flop 130. The D flip-flop 130 is clocked by the output of the divide-by-N counter 60 which is inverted by the inverter 80. The D flip-flop 130 is a latch and stores the results of the comparison between the system oscillator signal on IN line 9 and a delayed copy of that signal generated by the shift register 90.

When the D flip-flop 130 is activated by the clock signal from the inverter 80, the output of the D flip-flop 130 is fed to a monostable timer 140 which generates a signal which is used to drive an LED 150. The LED 150 is lit, if and only if, input A 200 or input B 210 of the XOR gate 110 is high, and the clock signal has arrived from inverter 80. Thus, whenever a timing error in the system oscillator's signal occurs, the LED 150 will light up for a predetermined amount of time.

Figure 4:
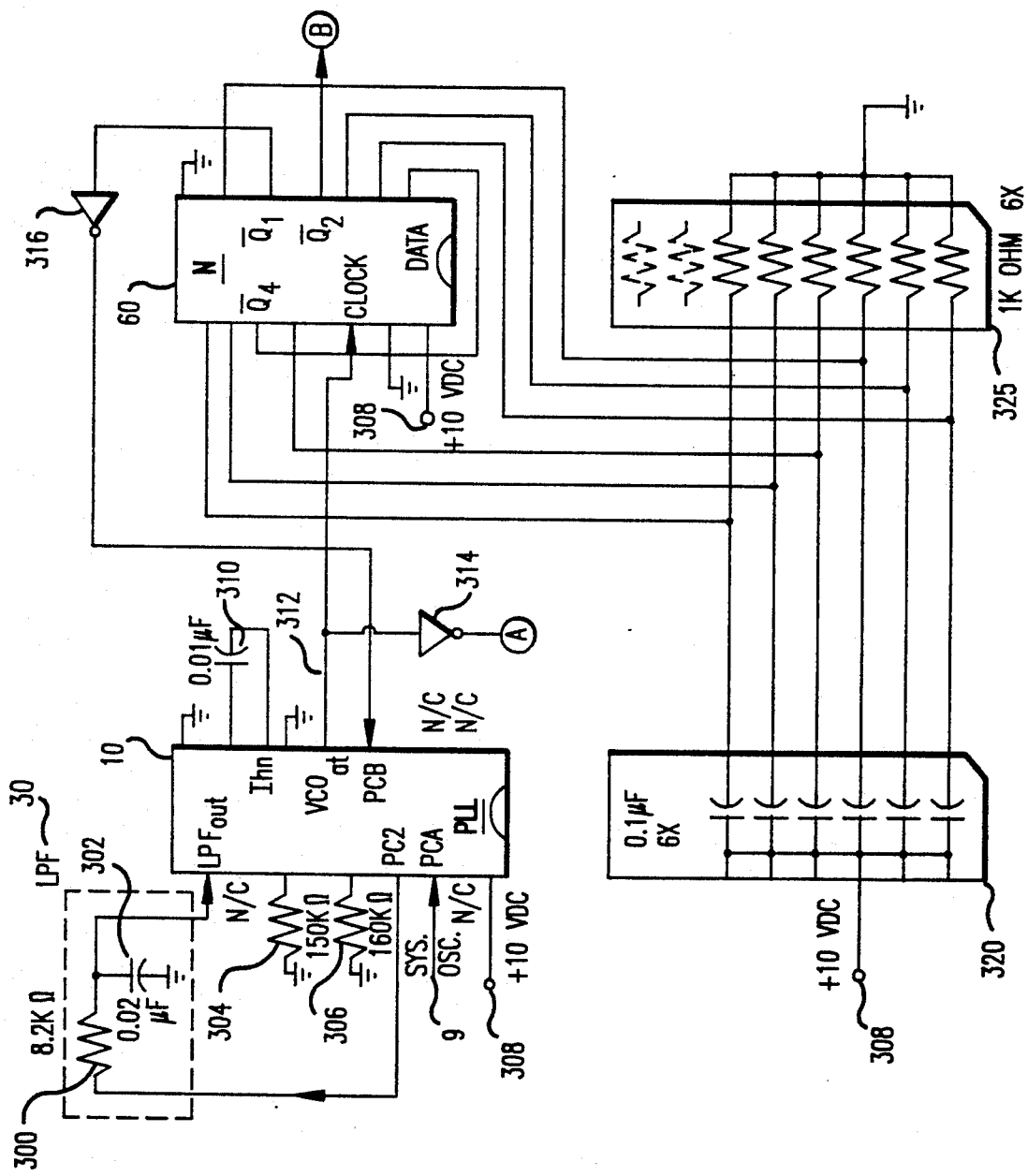
FIG. 4 is a circuit diagram of a phase-locked loop (PLL), a divide-by-N counter and biasing resistors and capacitors which are components of the preferred embodiment of the present invention.
Figure 6:
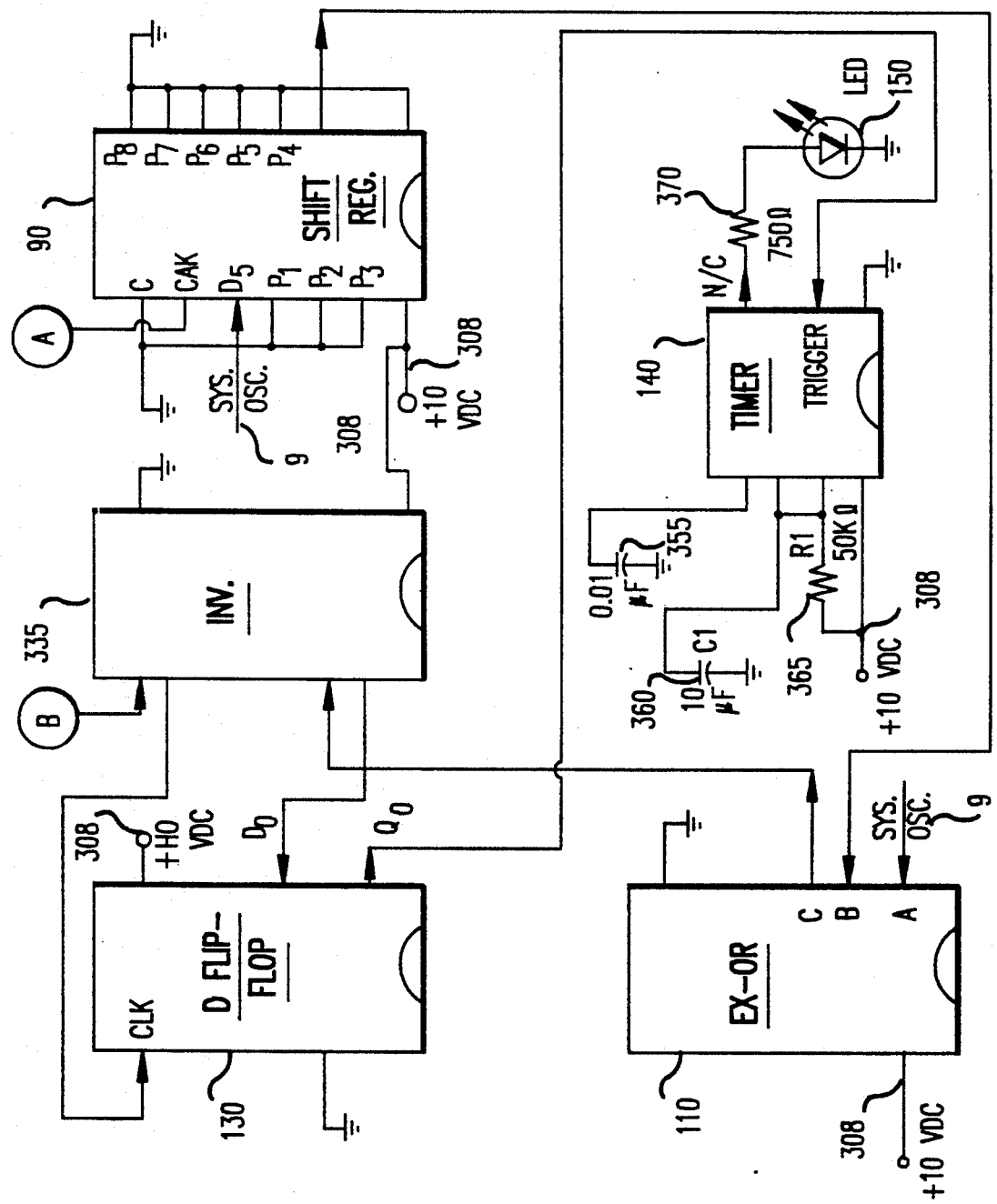
FIG. 6 is a circuit diagram of a latch circuit, an inverter, a shift register, a comparison circuit, a timer, and an LED which are components of the preferred embodiment of the present invention.

With reference to FIGS. 4 and 6, a hardware circuit diagram of the FIG. 2 schematic will now be described. The PLL 10, the divide-by-N counter 60, a capacitor bank 320, a resistor bank 325, the D flip-flop 130, the inverters 335, the shift register 90, the Exclusive-OR gate 110 and the timer 140 are all connected to a 10 volt DC line 308. The phase-locked loop (PLL) 10 is shown in integrated circuit form. The phase-locked loop is preferably an MC14046B phase-locked loop integrated circuit manufactured by Motorola Corporation which contains two phase comparators, a voltage controlled oscillator (VCO), a source follower, and a zener diode. The comparators share two common input signals PCA and PCB. Input PCA contains self-bias circuitry to handle a wide range of signal amplitudes. Only one of the phase comparators was used in order to implement this invention. The chosen phase comparator was selected because it contains leading edge sensing logic and provides an error signal PC2 which maintains a zero degree phase shift between the PCA and PCB input signals, immaterial of duty cycle.

The linear VCO within the PLL 10 produces an output signal VCO (out) whose frequency is determined by the voltage at VCO (in), a capacitor 310, and two resistors 304, 306. The inhibit input (Inh) must be grounded to enable the VCO. The VCO frequency range of 4 kilohertz was set by selecting f(min)= 6 kilohertz and f(max) = 10 kilohertz in accordance with equations (1) and (2):

$$f(min) = 1/[R2(C1 + 32pF)] + f(min) \quad (1)$$

$$f(max) = 1/[R1(C2 + 32Pf)] + f(min) \quad (2)$$

The following restrictions apply to the resistor and capacitor selections:

10 K-ohm $\leq$ R1 $\leq$ 1 M-ohm

10 K-ohm $\leq$ R2 $\leq$ 1 M-ohm 100 picofarad $\leq$ C1 $\leq$ 0.01 microfarad The nominal VCO operating frequency was thus chosen to be 8 kilohertz for a 1 kilohertz system oscillator frequency. The phase-locked loop permits the timing error detector to operate properly with a system oscillator in the frequency range of 0.75 kilohertz to 1.25 kilohertz. Thus, the timing error detector does not need to be critically tuned to the nominal frequency of the system oscillator.

The low-pass filter 30 is implemented with a resistor 300 and a capacitor 302 which properly filter out signals with frequencies in excess of 1 kilohertz. The waveforms in FIG. 5 illustrate the performance of the phase comparator and the function of the low-pass filter.

Figure 5:
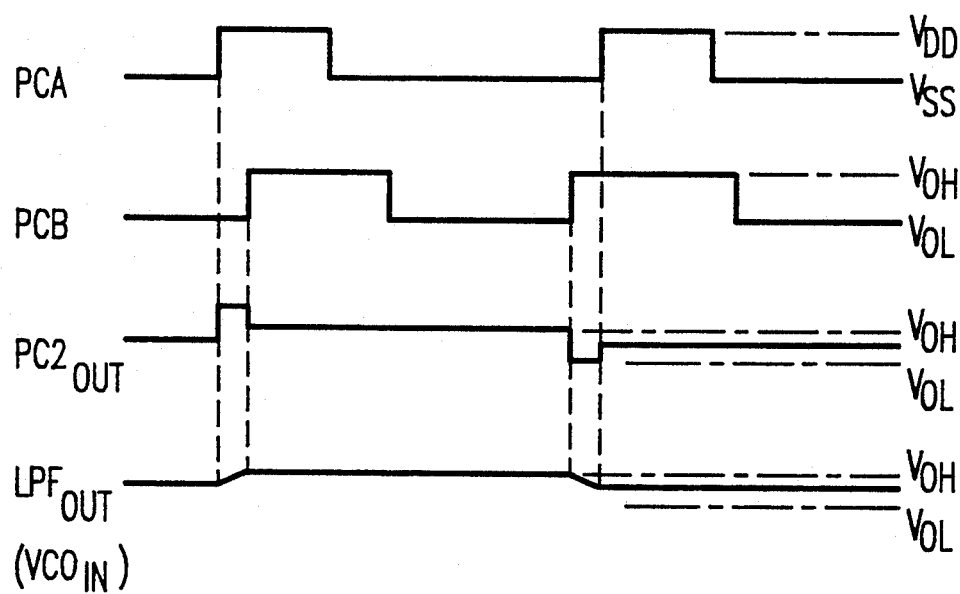
FIG. 5 is a timing diagram showing the operation of the phase-locked loop and low pass filter of FIG. 3.

In FIG. 5, PCA and PCB which are inputs of the phase comparator are shown with various signals. PC2 is the output of the phase comparator. $LPF_{out}$ is the output of the low-pass filter which is fed back into the phase comparator.

The presettable divide-by-N counter 60, shown in integrated circuit form, contains five counter stages which are asynchronously presettable and resettable. The counter 60 is preferably an MC14018B part manufactured by Motorola Corporation. The counter stages are synchronous and increment on the positive-going edge of a clock. Presetting is accomplished by applying a high signal on the preset enable input. Data on the Jam inputs will then be transferred to their respective Q outputs (inverted). A high signal on the Reset input will cause all Q outputs to go to a high state. The presetting function is accomplished at power-up by six individual R-C networks 320,325 connected to the DC power supply.

Division by 8 is accomplished by connecting the Q4 output to the Data input. The clock input is connected to the VCO output 312 of the PLL, and the Q1 signal (inverted by an inverter 316) is then connected to the PCB input of the phase comparator of the phase-locked loop circuit. The Q2 output which is fed through the inverter chip 335 is one VCO clock period behind Q1, and is used to drive the clock input of the D flip-flop 130.

The shift register 90 is shown in its integrated circuit form and preferably is an MC14014B 8-bit shift register manufactured by Motorola Corporation. The shift register can be operated in either a parallel or a serial fashion and provides Q outputs from the seventh, sixth and eighth stages. The timing error detector application requires the serial mode which is selected by grounding the P-S input. The asynchronous parallel inputs (P1-P8) are not needed and thus grounded to assure noise immunity. The system oscillator is connected to the $D_o$ (data) input. The VCO oscillator output 312 of the phase-locked circuit drives the clock input, CLK, through an inverter 314, and triggers all stages on the positive going edge of its waveform. The system oscillator ripples through all eight stages and arrives at the output (of the eighth stage of the shift register) delayed by one period of the system oscillator.

The XOR gate 110 is shown in FIG. 6 in its integrated circuit form and is preferably an MC14070B Quad Exclusive-Or part made by Motorola Corporation. It makes the comparison between the system oscillator signal and a delayed copy of that signal. If these waveforms differ due to a missing pulse or timing error, the Exclusive-Or's output will change from a low state to a high state. This output is then inverted by a gate within an inverter chip 335 to provide a high-to-low transition necessary to trigger the monostable timer 140.

The D flip-flop 130 is shown in its integrated circuit form and is preferably an MC14175B quad type D flip-flop manufactured by Motorola Corporation. The D flip-flop 130 is a positive edge triggered flip-flop which is triggered by the inverted Q2 output of the presettable divide-by-N counter 60. This output is one VCO clock period behind the inverted Q1 output which interfaces with the phase comparator 20. This delay allows for slight mismatch of up to ¼ of the system clock period to tolerate small amounts of propagation delay through the system. Also, the Exclusive-Or output is permitted to settle down after a transition (resulting from a detected system oscillator error) before outputting a signal to trigger the monostable circuit.

The monostable timer 140 is shown in its integrated circuit form and is preferably an LM555C timer circuit manufactured by Motorola Corporation. The timer circuit is connected in a monostable configuration. In this mode of operation, the timer functions as a one-shot timer. A capacitor 360 is initially discharged by a transistor inside of the timer. Upon application of a negative trigger pulse of less than 3.333 volts, the flip-flop is set which both releases the short circuit across the capacitor and drives the output high. The voltage across the capacitor then increases exponentially for a period of time at the end of which the voltages equal to 6.666 volts. The comparator then resets the flip-flop which in turn discharges the capacitor and drives the output to its low state.

A resistor 365 and the capacitor 360 were selected to produce a ½ second pulse from a negative input as short as 0.5 microseconds. This pulse drives the LED indicator light 150 via a current limiting resistor 370 to visibly indicate an error to an operator. This pulse could be used for other functions as required by each individual application.

While specific embodiments of the invention have been shown and described in detail to illustrate the application of the principles of the invention, it will be understood that the invention may be embodied otherwise without departing from such principles.

What is claimed is:

1. A method of detecting a timing error in a system oscillator signal of a system oscillator, comprising the steps of:
    generating a clock signal in phase with said system oscillator signal;
    applying said clock signal to a delay means;
    applying said system oscillator signal to said delay means and to a comparison means;
    delaying said system oscillator signal by means of said delay means by a time period equal to a single system oscillator signal period to generate a delayed signal;
    comparing said delayed signal with said system oscillator signal by means of said comparison means to generate a comparison signal;
    detecting an error when said comparison signal indicates that said delayed signal differs from said system oscillator signal; and
    generating an indication signal when an error has been detected by said detecting step.

2. The method of claim 1, further comprising storing said comparison signal for one period of said system oscillator signal.

3. The method of claim 1, wherein said comparison step detects missing system oscillator signal pulses and delayed system oscillator signal pulses.

4. The method of claim 1, further comprising filtering a phase error signal to eliminate any noise.

5. An apparatus for detecting a timing error in a system oscillator signal of a system oscillator, comprising:
    signal generation means for generating a clock signal in phase with said system oscillator signal;
    delay means, clocked by said clock signal, for delaying said system oscillator signal by one system oscillator signal period and generating a delayed signal; and
    comparing means for receiving said system oscillator signal from said system oscillator, for receiving said delayed signal from said delay means, and for comparing said system oscillator signal and said delayed signal to generate an alarm signal representing a timing error when said system oscillator signal differs from said delayed signal.

6. The apparatus of claim 5, further comprising storing means for storing a comparison signal for a time equal to one period of said system oscillator signal.

7. The apparatus of claim 5, further comprising indication means, responsive to said alarm signal, for generating a visible indication of said timing error.

8. The apparatus of claim 5, wherein said delay means comprises:
    a phase-locked loop for generating a high frequency signal;

a counter, electrically connected to an output of said phase-locked loop; and a shift register.

9. The apparatus of claim 5, wherein the comparing means comprises an Exclusive-OR logic gate.

10. The apparatus of claim 5, further comprising filtering means for filtering a phase error signal to remove noise and for generating a filtered signal which controls said signal generation means.

* * * * *